United States Patent
Yaoi et al.

(10) Patent No.: US 7,061,808 B2
(45) Date of Patent: Jun. 13, 2006

(54) SEMICONDUCTOR MEMORY DEVICE, DRIVING METHOD THEREOF, AND PORTABLE ELECTRONIC APPARATUS

(75) Inventors: Yoshifumi Yaoi, Yamatokooriyama (JP); Hiroshi Iwata, Nara (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 100 days.

(21) Appl. No.: 10/847,627

(22) Filed: May 18, 2004

(65) Prior Publication Data

US 2004/0233731 A1    Nov. 25, 2004

(30) Foreign Application Priority Data

May 19, 2003    (JP)    ............................. 2003-140708

(51) Int. Cl.
*G11C 16/04*    (2006.01)
(52) U.S. Cl. ........................... 365/185.19; 365/185.26; 365/185.33; 257/315; 257/316
(58) Field of Classification Search ........... 365/185.19, 365/185.26, 185.29, 185.33; 257/315, 316
See application file for complete search history.

(56) References Cited

U.S. PATENT DOCUMENTS 5,424,979 A * 6/1995 Morii .................... 365/185.28
5,608,669 A    3/1997 Mi et al.
5,892,710 A * 4/1999 Fazio et al. ............ 365/185.03
5,929,480 A * 7/1999 Hisamune .................. 257/320

FOREIGN PATENT DOCUMENTS

| JP | 5-81072 B2 | 11/1993 |
| JP | 5-304277 A | 11/1993 |
| JP | 9-116119 A | 5/1997 |
| JP | 2001-156188 A | 6/2001 |
| JP | 2001-156189 A | 6/2001 |
| JP | 2001-230332 A | 8/2001 |
| JP | 2002-190535 A | 7/2002 |
| WO | WO 99/07000 | 2/1999 |

* cited by examiner

*Primary Examiner*—Richard Elms
*Assistant Examiner*—Toan Le
(74) *Attorney, Agent, or Firm*—Birch, Stewart, Kolasch & Birch, LLP

(57) ABSTRACT

A semiconductor memory device includes a memory array; a storage section that receives a maximum pulse value from a user of the semiconductor memory device; a control section that executes a writing processing or an erasing processing for the memory array and restarts the writing or erasing processing in the case where the processing for the memory array has failed; a counter section that counts up a number of processings performed by the control section; and a detection section that detects when the number of processings is equal to the maximum pulse value to prevent the control section from restarting the writing or erasing processing.

15 Claims, 17 Drawing Sheets

US 7,061,808 B2

SEMICONDUCTOR MEMORY DEVICE, DRIVING METHOD THEREOF, AND PORTABLE ELECTRONIC APPARATUS

CROSS-REFERENCE TO RELATED APPLICATION

This application is related to Japanese patent application No. 2003-140708 filed on May 19, 2003, whose priority is claimed under 35 USC § 119, the disclosure of which is incorporated by reference in its entirety.

BACKGROUND OF THE INVENTION

1. Field of the Invention

The present invention relates to a semiconductor memory device using a nonvolatile memory, a method of driving the semiconductor memory device, and a portable electronic apparatus. More specifically, the present invention relates to a semiconductor memory device which enables a user to control writing or erasing time of a memory array, and a method of driving the semiconductor memory device.

2. Description of the Related Art

Conventionally, a flash memory is typically used as a nonvolatile memory.

In a flash memory, as shown in FIG. 26, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, Japanese Unexamined Patent Publication No. Hei 5-304277 (1993)).

The memory cell retains data according to a charge amount in the floating gate 902. In a memory cell array constructed by arranging memory cells, an operation of rewriting/reading a desired memory cell can be performed by selecting a specific word line and a specific bit line and applying a predetermined voltage.

In such a flash memory, when a charge amount in the floating gate changes, a drain current (Id)-gate voltage (Vg) characteristic as shown in FIG. 27 is displayed. When the amount of negative charges in the floating gate increases, the threshold increases, and an Id-Vg curve shifts almost in parallel in the direction of increasing Vg.

In such a flash memory, however, it is necessary to dispose the insulating film 907 for separating the floating gate 902 and the word line 903 from the functional viewpoint. In addition, in order to prevent leakage of charges from the floating gate 902, it is difficult to reduce the thickness of the gate insulating film. It is therefore difficult to effectively reduce the thickness of the insulating film 907 and the gate insulating film, and it disturbs reduction in size of the memory cell.

SUMMARY OF THE INVENTION

The present invention has been achieved in consideration of the problems and provides a semiconductor memory device having a memory cell which can be easily fined, a method of driving the semiconductor memory device, and a portable electronic apparatus.

The present invention provides, in one embodiment, a semiconductor memory device including: a memory array; a storage section that receives a maximum pulse value from a user of the semiconductor memory device; a control section that executes a writing processing or an erasing processing for the memory array and restarts the writing or erasing processing in the case where the processing for the memory array has failed; a counter section that counts up a number of processings performed by the control section; and a detection section that detects a moment when the number of processings is equal to the maximum pulse value to prevent the control section from restarting the writing or erasing processing, wherein the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

In the semiconductor memory device of an embodiment of the present invention, the memory functional unit of the memory cell may include a film having a surface substantially in parallel to a surface of the gate insulating film and having the function of retaining charges.

The memory cell may include a film having a surface substantially in parallel to a surface of the gate insulating film and the function of retaining charges, and an insulating film for separating the film from the channel region or the semiconductor layer, and the insulating film has a thickness thinner than the gate insulating film and not thinner than 0.8 nm.

The semiconductor layer of the memory cell may include a region of a higher concentration in the vicinity of the diffusion region than that of a region in the vicinity of a surface of a semiconductor layer under the gate electrode.

A portable electronic apparatus including the semiconductor memory device is also disclosed.

A method of driving a semiconductor memory device, is provided that includes the steps of: (1) determining a predetermined number of times of execution designated by a user for a processing for a memory array of the semiconductor memory device; (2) setting a pulse counter value to an initial value; (3) starting a writing processing or an erasing processing performed on the memory array by a state machine of the semiconductor memory device to change the pulse counter value; (4) verifying the memory array to determine whether the processing has succeeded; and (5) repeating steps (2) and (3) until the pulse counter value is equal to the predetermined number of times of execution in the case where it is determined that the processing has failed, wherein the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

Embodiments of the present invention also provide a method of driving a semiconductor memory device, including the steps of: (1) setting a pulse counter value to an initial value; (2) changing the pulse counter value when a writing processing or an erasing processing on a memory array starts; (3) verifying the memory array to determine whether the processing has succeeded; (4) comparing the pulse counter value with a final value when it is determined that the processing has failed; and (5) repeating steps (2) to (4) until the pulse count value is equal to the final value, wherein the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

In the method of driving the semiconductor memory device, the final value may be zero, and step (2) may further include the step of decreasing the pulse count value by one.

Alternatively, in the method of driving the semiconductor memory device, the initial value may be zero, and step (2) may further include the step of increasing the pulse count value by one.

Also described is a method of driving a semiconductor memory device, including the steps of: (1) setting a pulse counter value to an initial value; (2) registering a final value in a register; (3) changing the pulse counter value when a writing processing or an erasing processing for a nonvolatile memory array starts; (4) verifying the nonvolatile memory array to determine whether the processing has succeeded; (5) comparing the pulse counter value with a final value when it is determined that the wiring or erasing processing has failed; and (6) repeating steps (2) to (5) until the pulse count value is equal to the final value, wherein the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

In another embodiment, the present invention also provides a method of driving a semiconductor memory device, including the steps of: (1) receiving a maximum pulse command from a microprocessor; (2) receiving a predetermined number of times of execution designated by a user for a processing for a memory array in the semiconductor memory device, from the microprocessor; (3) starting on the memory array a writing processing or an erasing processing to be executed by a state machine of the semiconductor memory device; (4) verifying the memory array to determine whether the processing has succeeded; (5) repeating steps (2) and (3) until step (2) is executed by the predetermined number of times of execution in the case where the processing has failed, wherein the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

The step (2) may further include the step of storing a value designated by the user in a register.

The memory functional unit of the memory cell may include a film having a surface substantially parallel to a surface of the gate insulating film and having the function of retaining charges.

The memory cell may include a film having a surface substantially in parallel to a surface of the gate insulating film and the function of retaining charges, and an insulating film for separating the film from the channel region or the semiconductor layer, and the insulating film has a thickness thinner than the gate insulating film and not thinner than 0.8 nm.

The semiconductor layer of the memory cell may include a region of a higher impurity concentration in the vicinity of the diffusion region than that of a region in the vicinity of a surface of the semiconductor layer under the gate electrode.

BRIEF DESCRIPTION OF THE INVENTION

DETAILED DESCRIPTION OF THE INVENTION

Figure 1:
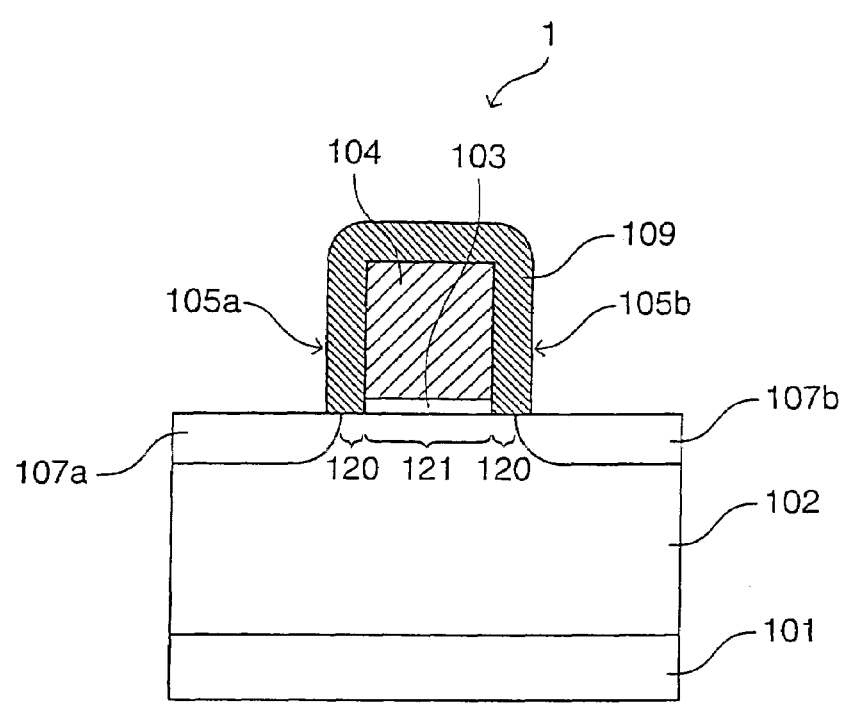
FIG. 1 is a schematic sectional view showing a main part of a memory cell (first embodiment) in a semiconductor memory device according to an embodiment of the present invention.

According to an embodiment of the present invention, the memory cell forming a memory array is mainly constructed by a semiconductor layer, a gate insulating film, a gate electrode, a channel region, a diffusion region and a memory functional unit. Herein, the channel region is normally a region of the same conductive type as that of the semiconductor layer and denotes a region immediately below the gate electrode. The diffusion region denotes a region of the conductive type opposite to that of the channel region.

Specifically, the memory cell of an embodiment of the present invention may be constructed by a region of a first conductive type as a diffusion region, a region of a second conductive type as a channel region, a memory functional unit disposed across a border of the regions of the first and second conductive types, and an electrode provided via a gate insulating film. It is suitable that the memory cell of an embodiment of the present invention is constructed by a gate electrode formed on a gate insulating film, two memory functional units formed on both sides of the gate electrode, two diffusion regions disposed on the opposite sides of the gate electrode of the memory functional units, and a channel region disposed below the gate electrode.

In the semiconductor device of an embodiment of the present invention, the semiconductor layer is formed on the semiconductor substrate, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer and a body region may be provided below a channel region.

The gate insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is formed preferably in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and an example of thereof includes a conductive film, for example, a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. A channel region is formed below the gate electrode.

Preferably, the gate electrode is formed only on the sidewalls of the memory functional unit or does not cover the top part of the memory functional unit. A contact plug can be disposed closer to the gate electrode by such arrangement, so that reduction in the size of the memory cell is facilitated. It is easy to manufacture the memory cell having such simple arrangement, so that the yield can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

Reliability of storage and retention can be increased by using the insulating film including a film having the charge retaining function such as a silicon nitride film as the memory functional unit. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

The film having the charge retaining function does not always have to have a film shape in order to increase the reliability of storage and retention. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, a ferroelectric film such as PZT or PLZT in which the polarization direction changes according to the electric field may be used as a memory functional unit. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

A film having a region or function of suppressing escape of charges is suitable as the insulating film constructing the memory functional unit. An example of a film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth almost the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly preferable that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film is made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The memory cell of an embodiment of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface of the opening, and the gate electrode material film is patterned in a shape including the opening and larger than the opening.

One example of a method for forming the memory cell according to an embodiment of the present invention will now be described.

First, the gate insulating film and the gate electrode are formed on the semiconductor substrate in accordance with known procedures. Subsequently, a silicon oxide film having a thickness of 0.8 to 20 nm, more preferably 3 to 10 nm is formed by thermal oxidation or deposited by CVD (Chemical Vapor Deposition) over the entire semiconductor substrate. Next, a silicon nitride film having a thickness of 2 to 15 nm, more preferably 3 to 10 nm is deposited by the CVD over the entire silicon oxide film. Moreover, another silicon oxide film having a thickness of 20 to 70 nm is deposited by the CVD over the entire silicon nitride film.

Subsequently, the silicon oxide film/silicon nitride film/silicon oxide film are etched back by anisotropic etching, thereby forming the memory functional unit optimum for storing data on the sidewall of the gate electrode in the form of a sidewall spacer.

Thereafter, ions are injected while using the gate electrode and the memory functional unit in the form of the sidewall spacer as masks, thereby forming a diffusion layer region (source/drain region). After that, a silicide process or an upper wiring process may be performed in accordance with known procedures.

In the case of constructing the memory cell array by arranging memory cells of the present invention, the best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface almost parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is substantially parallel to the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. Benefits are obtained even if fewer than all 10 requirements are satisfied. It is sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the memory cell satisfies at least the requirements (3) and (9), it is very useful for the following reasons. First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo etching process for isolating the memory functional unit becomes unnecessary, and the manufacturing process is simplified.

Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo etching process for isolating the memory functional unit for each memory cell is preferable, and a margin for positioning in the photolithography process and a margin for film reduction by etching are preferable.

Moreover, since the electrode having the function of assisting the writing and erasing operations does not exist on the memory functional unit and the device structure is simple, the number of processes decreases, so that the yield can be increased. Therefore, it facilitates formation with a transistor as a component of a logic circuit or an analog circuit, and a cheap semiconductor memory device can be obtained.

Additional benefits are obtained when not only the requirements (3) and (9) but also the requirement (6) are satisfied.

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

In the semiconductor memory device of an embodiment of the present invention, a transistor may be connected in series with one of or both sides of a memory cell, or the memory cell may be mounted on the same chip with a logic transistor. In such a case, the semiconductor device, particularly, the memory cell can be formed by a process having high compatibility with a process of forming a normal standard transistor such as a transistor or a logic transistor, they can be formed simultaneously. Therefore, a process of forming both the memory cell and a transistor or a logic transistor is very simple and, as a result, a cheap embedded device can be obtained.

In the semiconductor memory device of an embodiment of the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of an embodiment of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multi-processor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of an embodiment of the present invention may be provided as at least a part of a control circuit or a data storing circuit of an electronic device or, as necessary, detachably assembled.

DESCRIPTION OF THE PREFERRED EMBODIMENTS

Hereinafter, embodiments of the semiconductor memory device, the display device and the portable electronic apparatus of the present invention will be described in detail with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
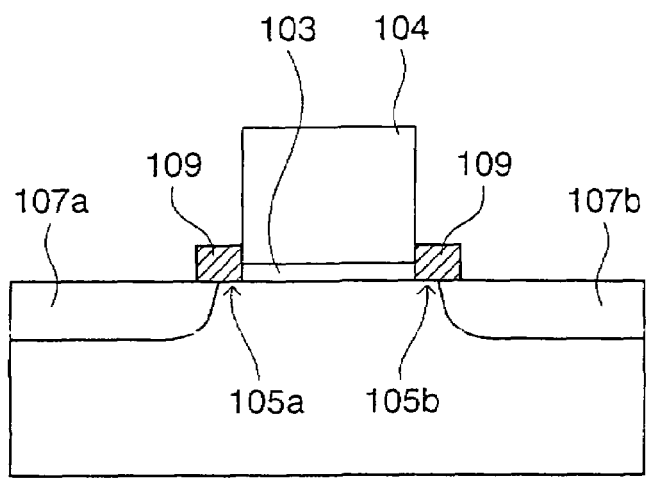
FIGS. 2A and 2B are schematic sectional views each showing a main part of a modification of the memory cell (first embodiment) in the semiconductor memory device according to an embodiment of the present invention.
Figure 2B:
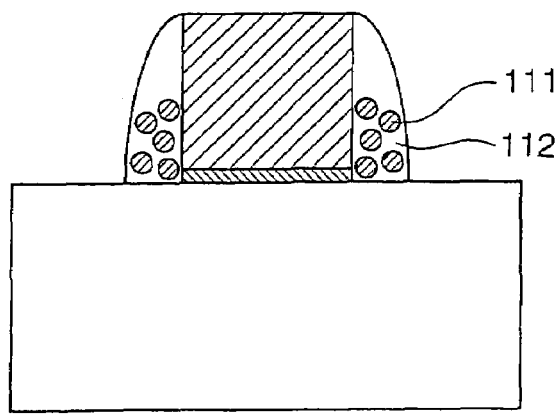

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go through the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131a and 131b have the function of retaining charges will be described. "Writing" denotes herein injection of electrons into the memory functional units 131a and 131b when the memory cell is of the N channel type. Hereinafter, on assumption that the memory cell is of the N channel type, description will be given.

Figure 3:
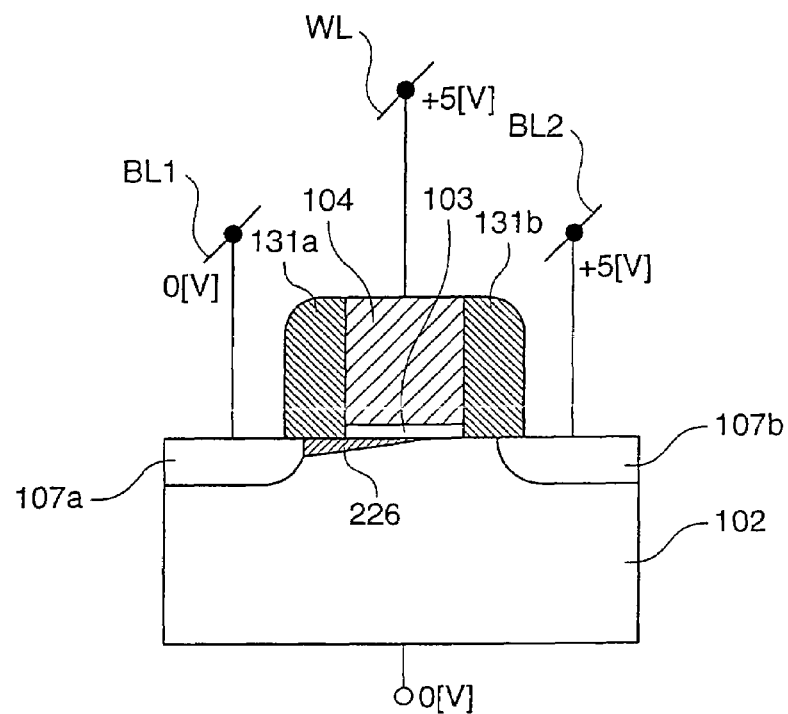
FIG. 3 is a diagram for describing a writing operation of the memory cell (first embodiment) in the semiconductor memory device according to an embodiment of the present invention.

In order to inject electrons (write) the second memory functional unit 131b, as shown in FIG. 3, the first diffusion region 107a of the N type is set as a source electrode, and the second diffusion region 107b of the N type is set as a drain electrode. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). By injection of the hot electrons into the second memory functional unit 131b, writing is performed. Since hot electrons are not generated in the vicinity of the first memory functional unit 131a, writing is not performed.

Figure 4:
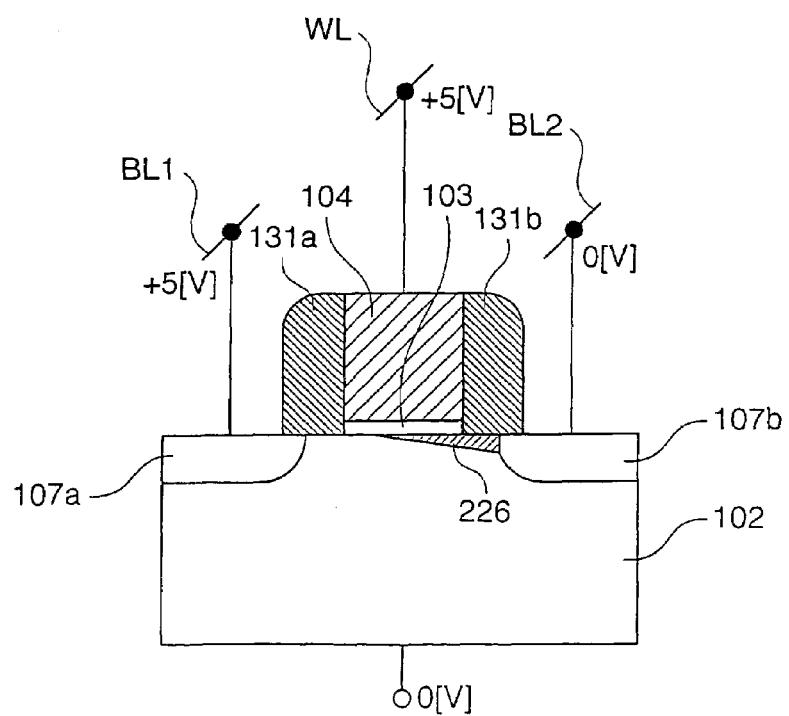
FIG. 4 is a diagram for describing a writing operation of the memory cell (first embodiment) in the semiconductor memory device according to an embodiment of the present invention.

On the other hand, in order to inject electrons (write) into the first memory functional unit 131a, as shown in FIG. 4, the second diffusion region 107a is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. By interchanging the source and drain regions so as to be different from the case of injecting electrons into the second memory functional unit 131b, electrons are injected into the first memory functional unit 131a and writing can be performed.

The principle of erasing operation of the memory cell will now be described with reference to FIGS. 5 and 6.

Figure 5:
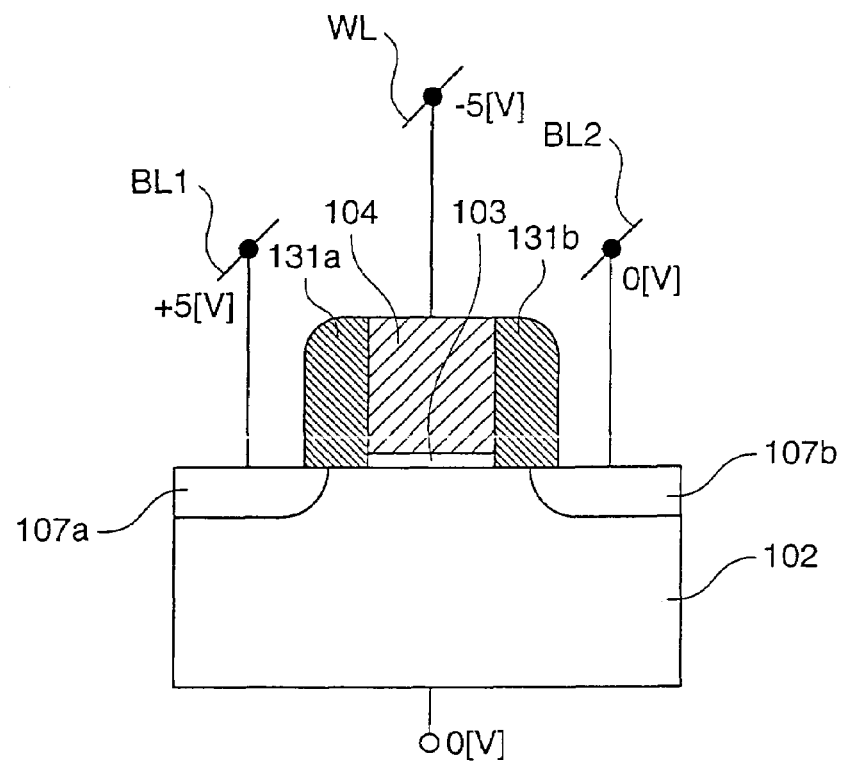
FIG. 5 is a diagram for describing an erasing operation of the memory cell (first embodiment) in the semiconductor memory device according to an embodiment of the present invention.

In a first method of erasing information stored in the first memory functional unit 131a, by applying positive voltage (for example, +5 V) to the first diffusion region 107a and applying 0 V to the P-type well region 102 as shown in FIG. 5, the PN junction between the first diffusion region 107a and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
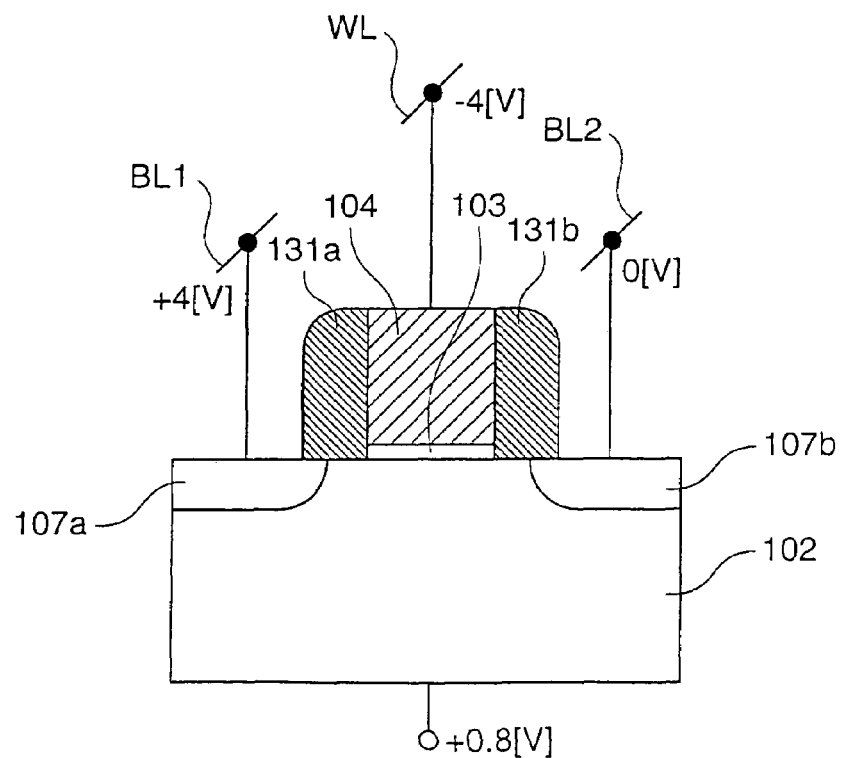
FIG. 6 is a diagram for describing an erasing operation of the memory cell (first embodiment) in the semiconductor memory device according to an embodiment of the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of an embodiment of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

The memory cell includes a gate electrode formed on a semiconductor layer via a gate insulating film, a channel region disposed under the gate electrode, diffusion regions disposed on both sides of the channel region, and memory functional units formed on both sides of the gate electrode and having the function of retaining charges. The memory functional units are separated by the gate electrode from each other. It is therefore easy to reduce the thickness of the gate insulating film as compared with the conventional flash memory. As a result, it is possible to easily apply an electric field, which is stronger than conventional one, from the gate electrode to the PN junction, and to realize a high-speed erasing operation with low voltage.

In addition, it is desired that a charge retaining region in the memory functional unit overlaps with the diffusion region. By overlapping the diffusion region with the charge retaining region in the memory functional unit, hot holes are generated in a first erasing method and distance between the PN junction, in which an electron-hole couple is generated in a second erasing method, and the charge retaining region becomes shorter, so that it is possible to realize a high-speed erasing operation with low voltage.

Figure 7:
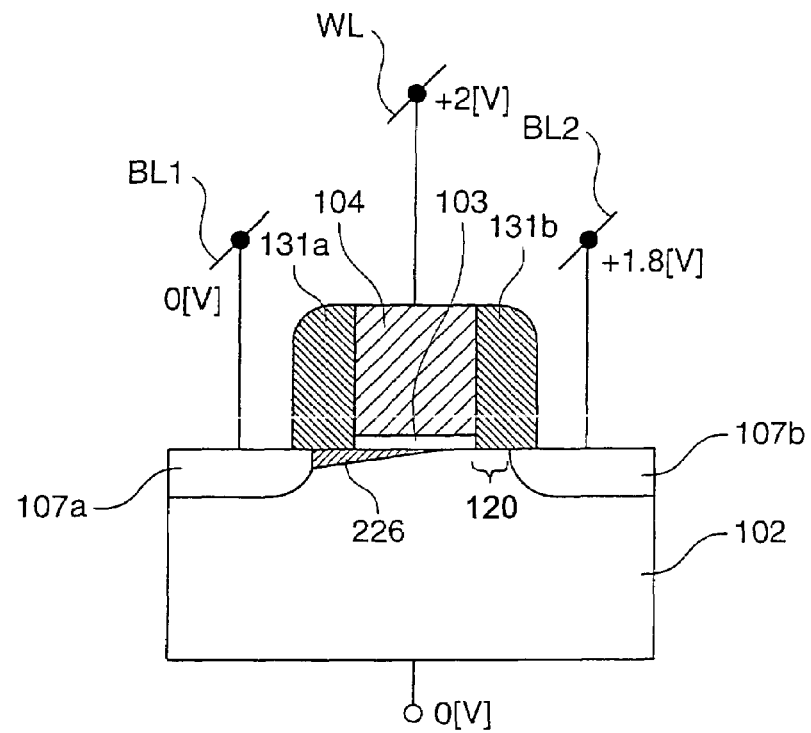
FIG. 7 is a diagram for describing a reading operation of the memory cell (first embodiment) in the semiconductor memory device according to an embodiment of the present invention.

Further, the principle of reading operation of the memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. The presence/absence of charge accumulation in the second memory functional unit 131b does not exert an influence on the drain current since the pinch-off point occurs in the area in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0 V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be constructed.

In the above-described operating method, by interchanging the source electrode and the drain electrode, writing and erasing of two bits per one transistor are performed. Alternately, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As obvious from the above description, in the memory cell in the semiconductor memory device of an embodiment of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Figure 8:
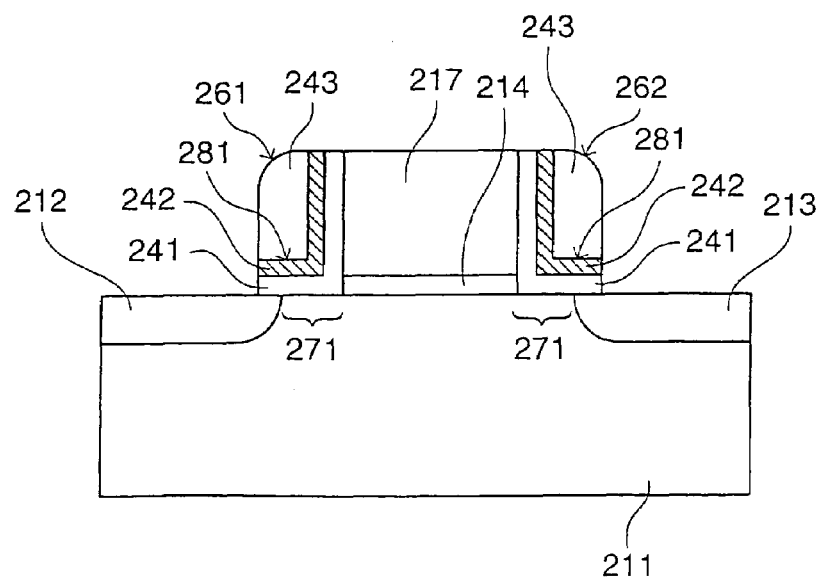
FIG. 8 is a schematic sectional view showing a main part of a memory cell (second embodiment) in the semiconductor memory device according to an embodiment of the present invention.

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film is regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
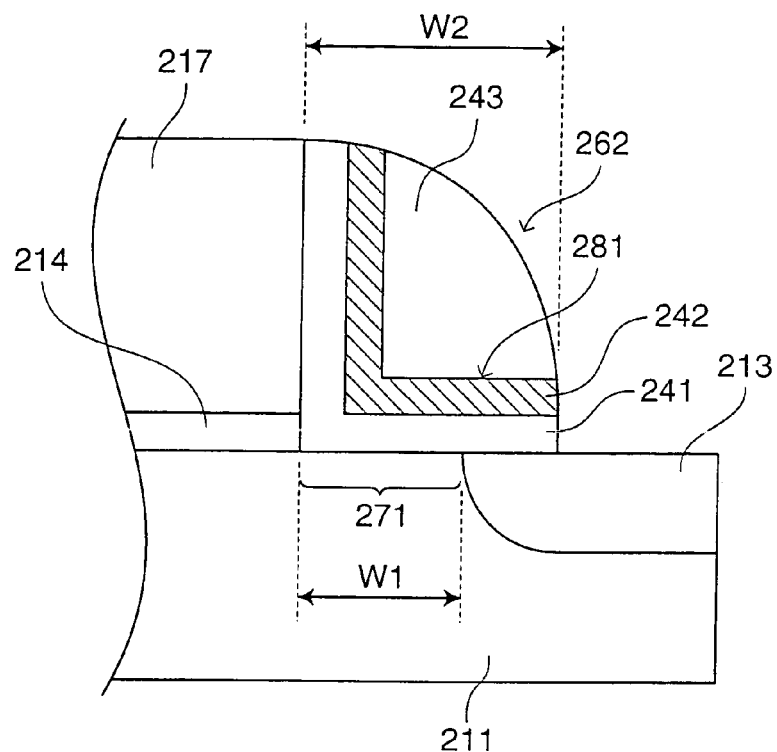
FIG. 9 is an enlarged schematic sectional view of the main part shown in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2–W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
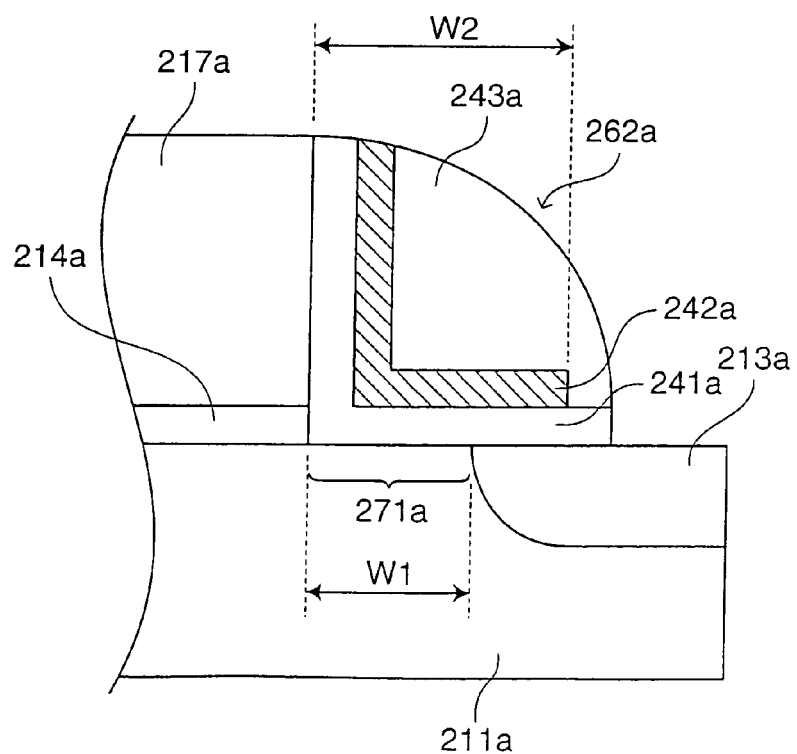
FIG. 10 is an enlarged schematic sectional view of a modification of the main part shown in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
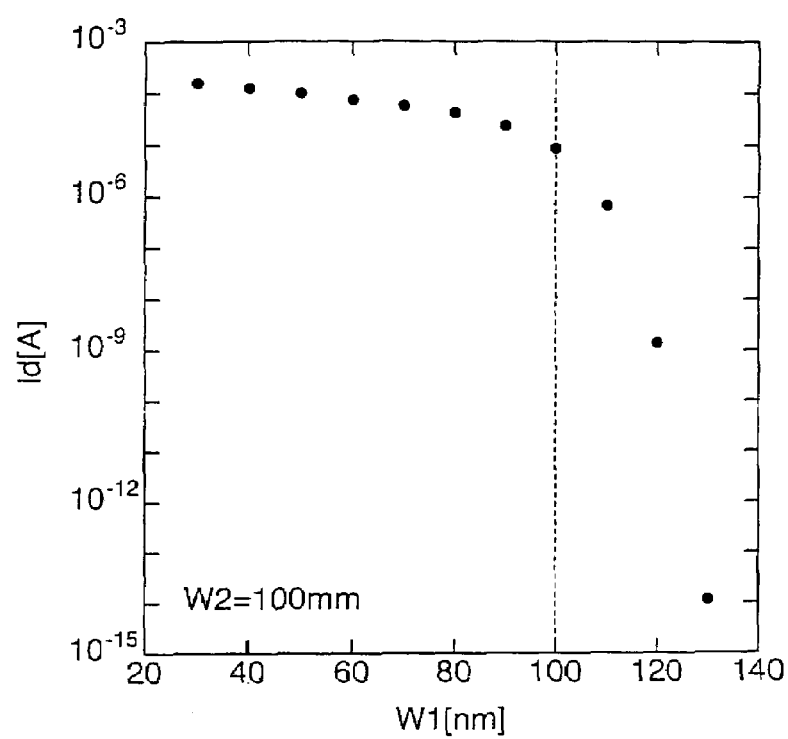
FIG. 11 is a graph showing electric characteristics of the memory cell (second embodiment) in the semiconductor memory device according to an embodiment of the present invention.

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, memory cell arrays were produced. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
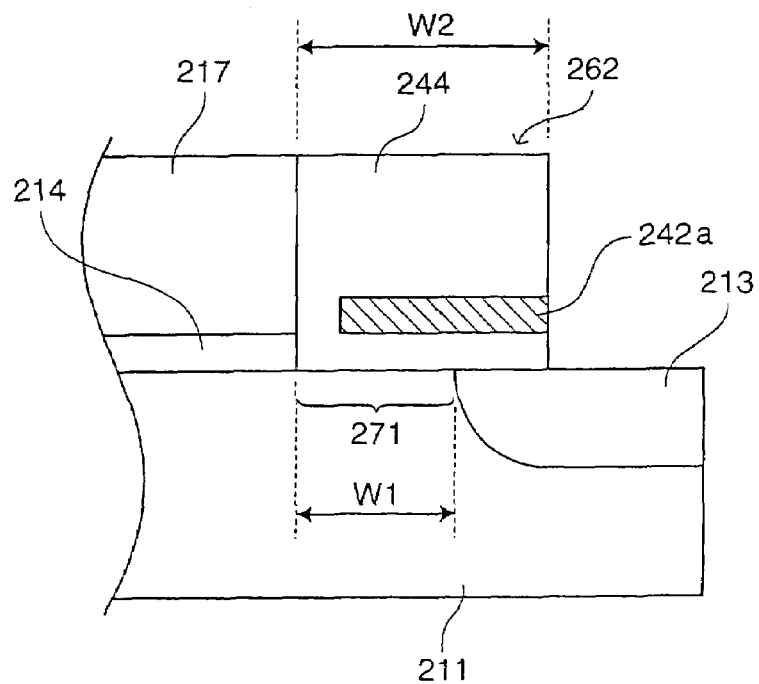
FIG. 12 is a schematic sectional view showing a main part of a modification of the memory cell (second embodiment) in the semiconductor memory device according to an embodiment of the present invention.

The memory functional unit preferably includes the charge retaining film disposed substantially parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface substantially parallel with the surface of the gate insulating film 214. In other words, it is preferable that the silicon nitride film 242a is formed at a level parallel to the level corresponding to the surface of the gate insulating film 214.

By the existence of the silicon nitride film 242a substantially parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a substantially parallel with the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is parallel to the surface of the gate insulating film 214 and the channel region (or well region). By the insulating film, dissipation of the charges accumulated in the charge retaining film is suppressed and a memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be substantially controlled, and variations in the memory effect of the memory cell can be reduced very much.

Figure 13:
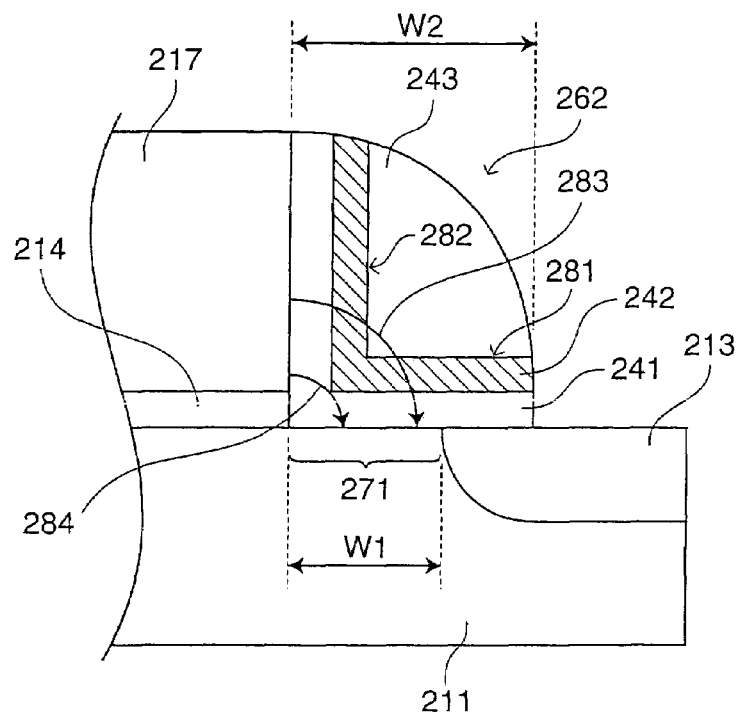
FIG. 13 is a schematic sectional view showing a main part of a memory cell (third embodiment) in the semiconductor memory device according to an embodiment of the present invention.

The memory functional unit 262 in a semiconductor memory device of a third embodiment has a shape in which the silicon nitride film 242 as a charge retaining film has substantially uniform thickness and is disposed substantially in parallel with the surface of the gate insulating film 214 as shown in FIG. 13 (region 281) and, further, substantially parallel with a side face of the gate electrode 217 (region 282)

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended substantially parallel to the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

In a fourth embodiment, optimization of the gate electrode, the memory functional unit, and the distance between the source and drain regions of a memory cell in a semiconductor memory device will be described.

Figure 14:
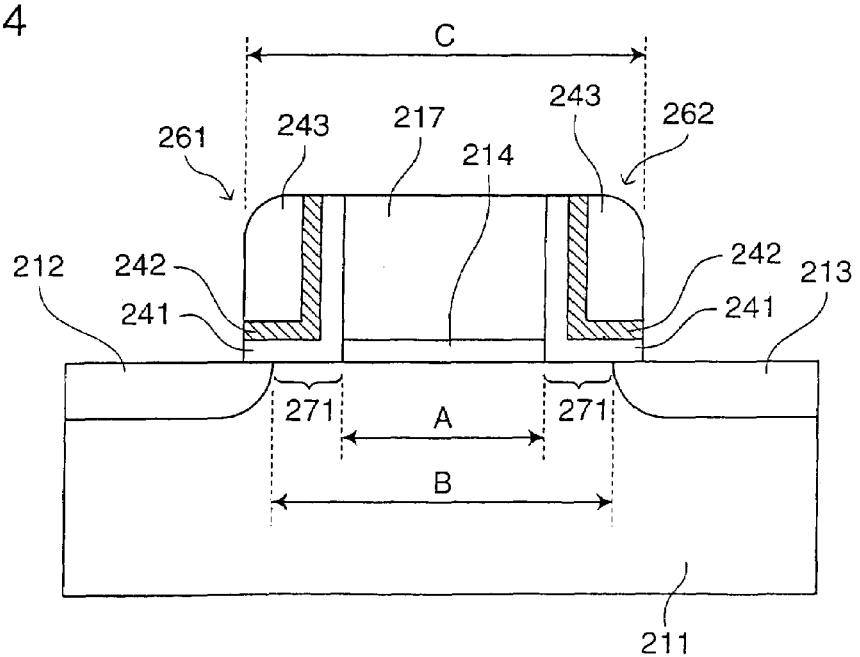
FIG. 14 is a schematic sectional view showing a main part of a memory cell (fourth embodiment) in the semiconductor memory device according to an embodiment of the present invention.

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
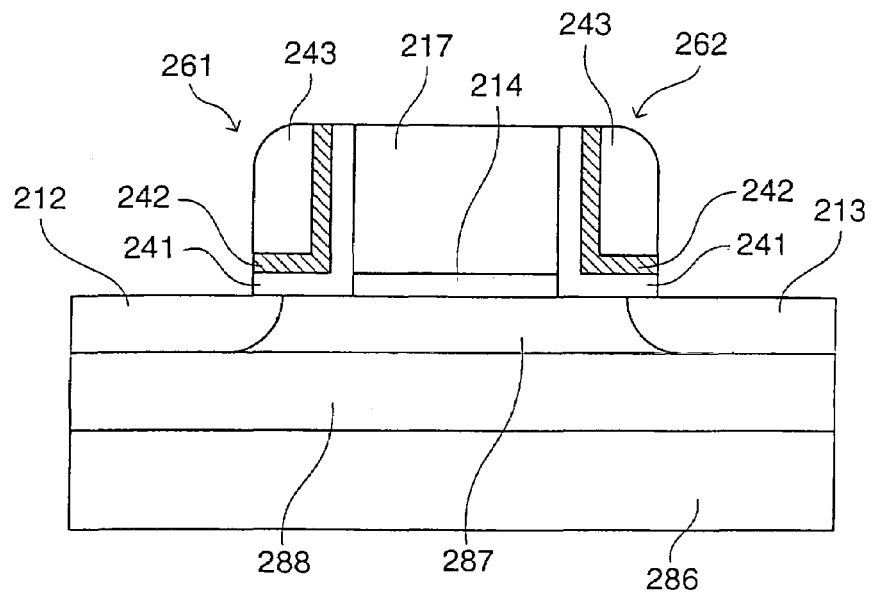
FIG. 15 is a schematic sectional view showing a main part of a memory cell (fifth embodiment) in the semiconductor memory device according to an embodiment of the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
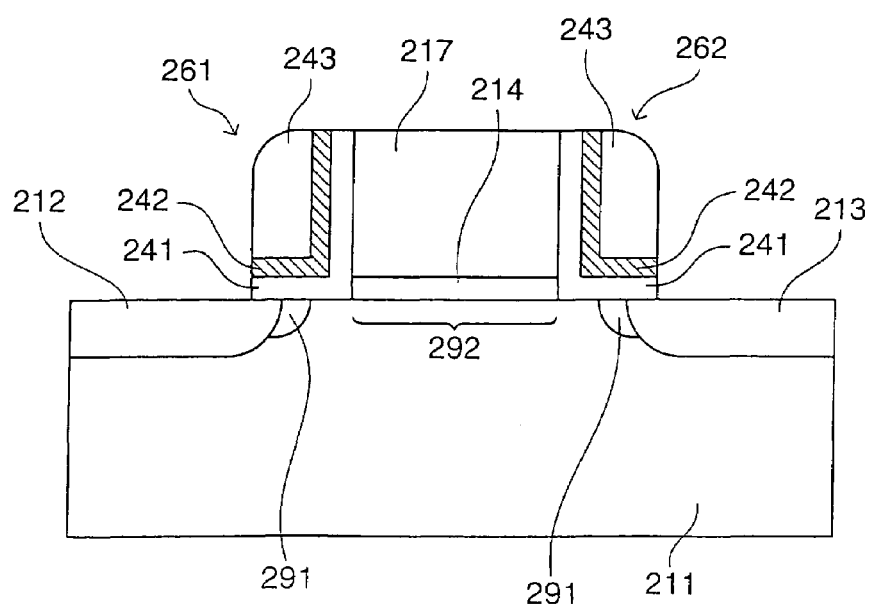
FIG. 16 is a schematic sectional view showing a main part of a memory cell (sixth embodiment) in the semiconductor memory device according to an embodiment of the present invention.

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5\times10^{17}$ to $1\times10^{19}$ cm$^{-3}$. The P-type impurity concentration of the region 292 can be set to, for example, $5\times10^{16}$ to $1\times10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
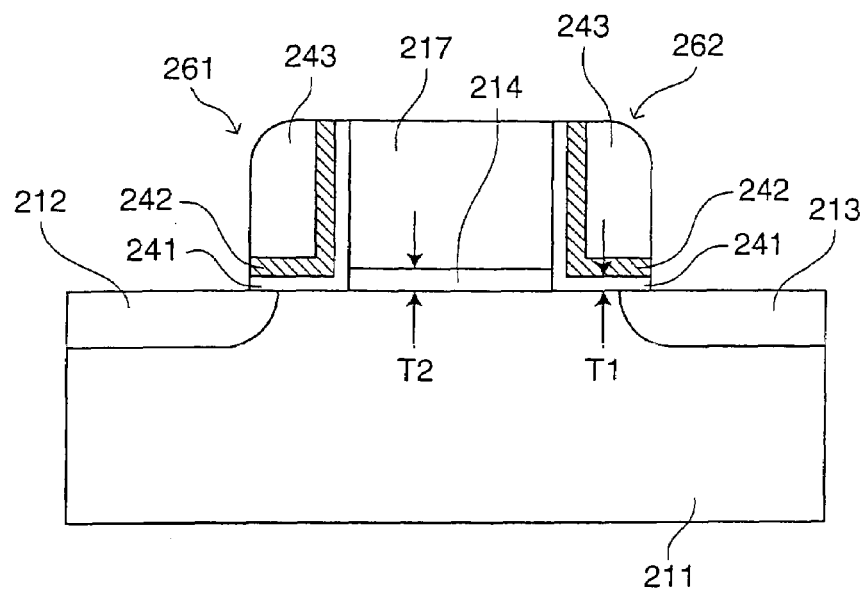
FIG. 17 is a schematic sectional view showing a main part of a memory cell (seventh embodiment) in the semiconductor memory device according to an embodiment of the present invention.

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the memory cell is inhibited.

As should be apparent from the above, by setting T1<T2, without deteriorating the withstand voltage performance of the memory, the voltage of the writing and erasing operations is decreased, or the writing operation and erasing operation are performed at high speed and, further, the memory effect can be increased. More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) and the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
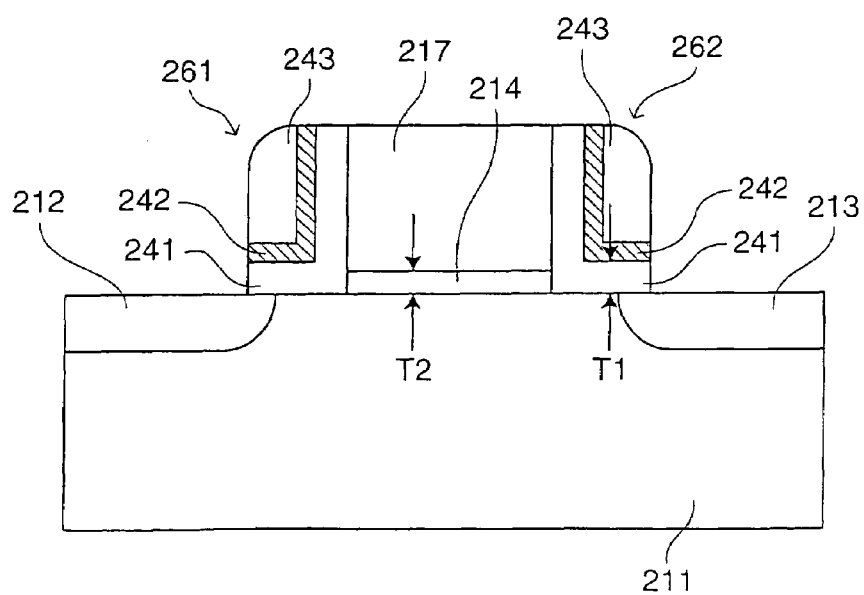
FIG. 18 is a schematic sectional view showing a main part of a memory cell (eighth embodiment) in the semiconductor memory device according to an embodiment of the present invention.

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically; when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
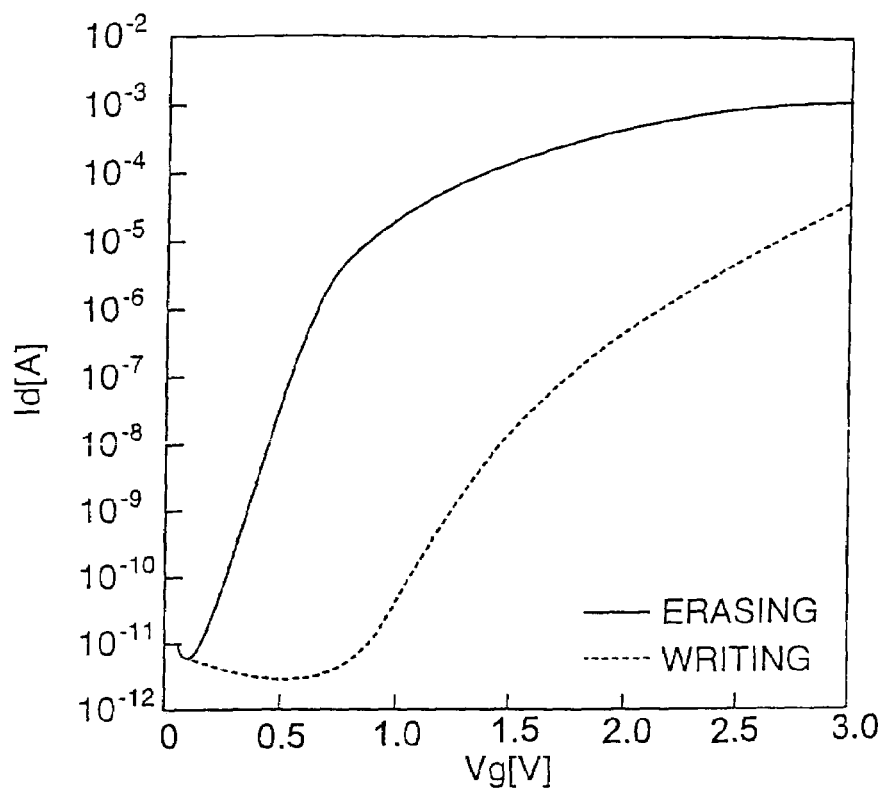
FIG. 19 is a graph showing electric characteristics of a memory cell (ninth embodiment) in the semiconductor memory device according to an embodiment of the present invention.

In an N-channel type memory cell, when an amount of charges in a memory functional unit changes, a drain current (Id)-gate voltage (Vg) characteristic (actual measurement value) as shown in FIG. 19 is exhibited.

Figure 27:
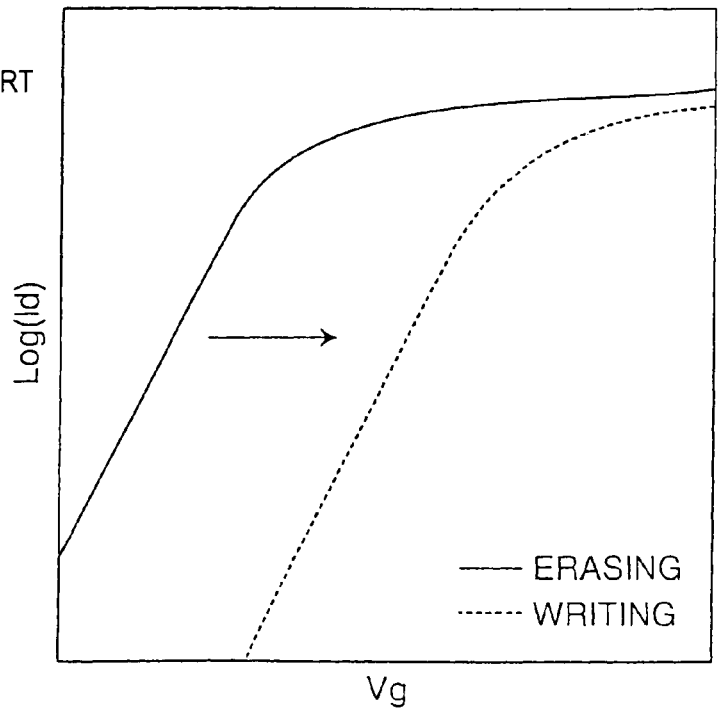
FIG. 27 is a graph showing electric characteristics of a conventional flash memory.

As will be apparent from FIG. 19, in the case of performing a writing operation in an erasing state (solid line) not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 27)

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As will be understood from the above, in the memory cell in the semiconductor memory device of an embodiment of the present invention, the drain current ratio between the writing operation and the erasing operation can be particularly made high.

A tenth embodiment relates to a semiconductor memory device in which the plurality of memory cells of any of the first to eighth embodiments are arranged to constitute a memory array, and to which a drive circuit is added, and relates to a method of driving the semiconductor memory device.

Namely, each of the memory cells in the memory array in this embodiment refers to a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and which having a function of retaining charges.

Figure 20:
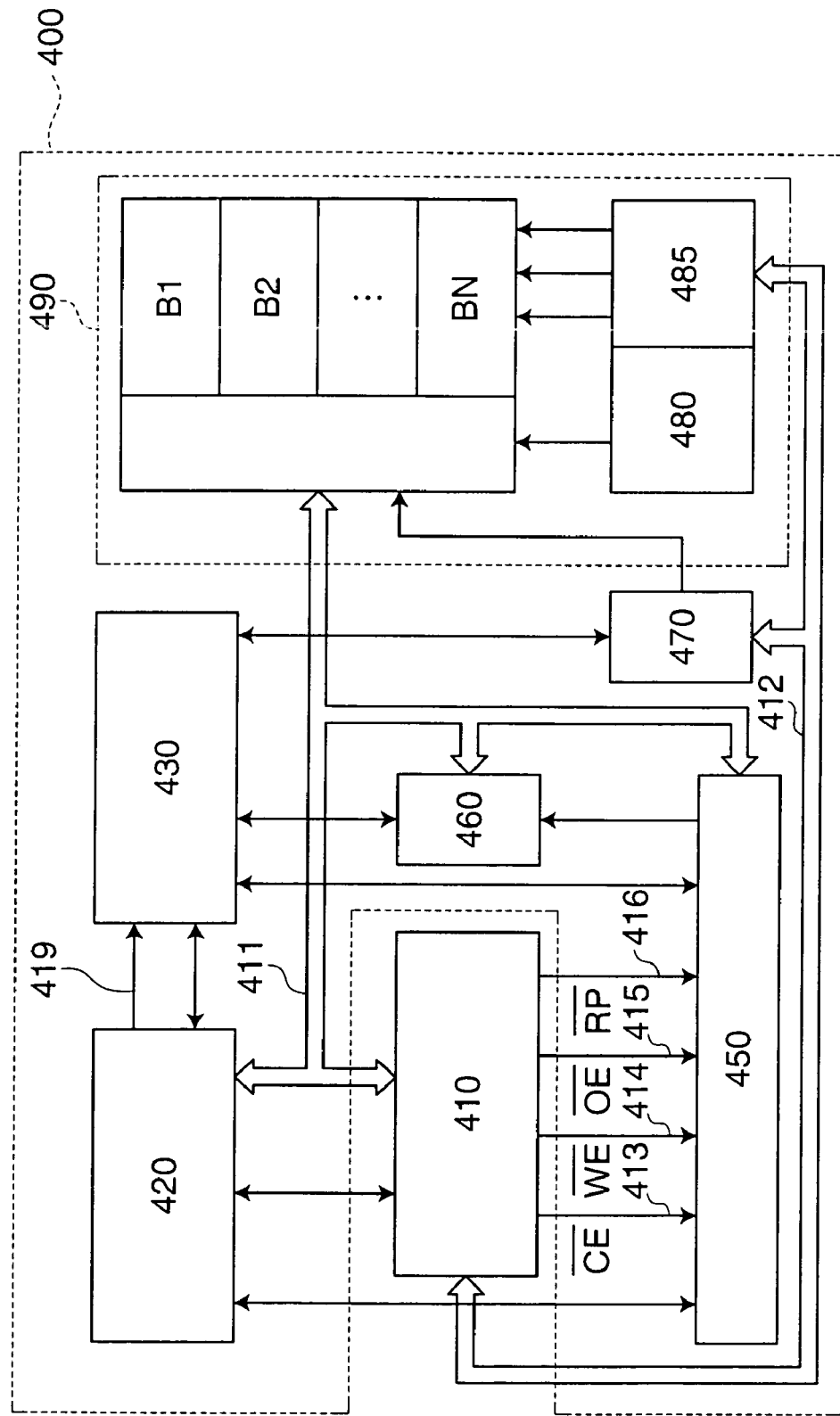
FIG. 20 is a block diagram showing a semiconductor memory device (tenth embodiment) according to an embodiment of the present invention.

FIG. 20 is a block diagram of a semiconductor memory device 400. The semiconductor memory device 400 is manufactured on a single substrate. A microprocessor 410 accesses a memory array 490 by transmitting a command onto a data bus 411 and transmitting an address onto an address bus 412. In another example of the microprocessor 410, the microprocessor 410 includes a microcontroller, a state machine, an application specific integrated circuit, and the other circuits that control the semiconductor memory device 400.

The semiconductor memory device 400 is connected to the microprocessor 410 via the data bus 411, the address bus 412, and other pins coupled to the semiconductor memory device 400. As shown in FIG. 20, a pin symbol, e.g., a bar added on CE denotes that a pin is active at LOW. When a logic "0", signal is outputted from a pin, the pin is active. When a logic "1" signal is outputted from the pin, the pin is inactive.

A CE pin 413 is a chip enable pin that controls a power supply of the semiconductor memory device 400. When the CE pin 413 is active, an internal control circuit and a buffer circuit of the semiconductor memory device 400 are turned on. When the CE pin 413 is inactive, the semiconductor memory device 400 turns into a power saving standby mode. The semiconductor memory device 400 in another example includes one or more CE pins. When all of the CE pins are active, the semiconductor memory device 400 is selected. This example is particularly effective for a large-sized array that includes a plurality of semiconductor memory devices.

An OE pin 415 is an enable output pin for the semiconductor memory device 400. When both of the OE pin 415 and the CE pin 413 are active, an output on the data bus 411 is gated to the microprocessor 410. A WE pin 414 is a rewriting enable pin.

The rewriting enable pin controls a user command interface 450 for rewriting. When the CE pin 413 is active, the semiconductor memory device 400 latches the address and the data at a rising edge of the WE. To this end, standard microprocessor timing is used.

An RP pin 416 is a reset/power-down pin. When the PR pin 416 is active, the semiconductor memory device 400 turns into a sleep mode in which the semiconductor memory device 400 consumes only a power lower than that in the standby mode. While the semiconductor memory device 400 is in the sleep mode, reading, writing and erasing are disabled in the memory array 490. When the RP pin 416 turns active, a state machine 430 is reset and the semiconductor memory device 400 turns into the sleep mode.

The memory array 490 is constructed by a plurality of blocks of memory cells B1 to BN. Alternatively, the memory array 490 may be constructed by a single block. While the memory array 490 is being accessed, an X decoder 480 receives the address from the microprocessor 410 through the address bus 412, and selects an appropriate row in the memory array 490. Likewise, a Y decoder 485 receives the address and selects an appropriate column in the memory array 490.

The semiconductor memory device 400 includes the state machine 430 so as to execute rewriting sequences such as a writing sequence and an erasing sequence on the memory array 490.

The state machine 430 controls a voltage applied to the memory array 490 through a voltage control circuit 470, thereby executing the writing and erasing sequences. The state machine 430 includes, for example, a microcontroller and controls the erasing and writing sequences for the memory array 490 using a micro-code. Alternatively, the state machine 430 may be constructed by a programmable logic array (hereinafter, "PLA").

The user command interface 450 is an interface between the microprocessor 410 and the internal processing circuit of the semiconductor memory device 400. Each command is transmitted from the microprocessor 410 and latched by the user command interface 450 through the data bus 411. The user command interface 450 decodes the command and generates a signal used in the other circuits of the semiconductor memory device 400. When the microprocessor 410 outputs a read command, the user command interface 150 commands either the memory array 490 or a status register 460 to read data. When the microprocessor 410 outputs a write command or an erase command, the user command interface 450 transmits a signal to the state machine 430 to cause the state machine 430 to start a correct sequence. The status register 460 reflects a status of the state machine 430 during its processing period.

The status register 460 issues the following commands to the microprocessor 410.

(a) Whether the state machine 430 can receive the other command.

(b) Whether the state machine 430 has finished a present processing.

(c) Whether the present processing has succeeded or failed.

The memory array 490 includes, for example, a plurality of blocks. The status register 460 includes a plurality of blocks of status registers that reflect statuses of the respective blocks in the memory array 490. To erase data from one block in the memory array 490, it is necessary to apply a high voltage to a memory transistor. If no high voltage is applied thereto, the memory array 490 does not turn into a read-only mode.

The voltage control circuit 470 includes a switch for supplying a voltage at a necessary level to the memory array 490 during the reading writing or erasing processing period. The writing processing for a memory cell is performed by applying a voltage of 5 V to a gate and a voltage of 5 V to a drain, and setting a source to have a ground potential. Data in the memory cell is erased by applying a voltage of 5 V to the source and a voltage of −5 V to the gate, and setting the drain to have the ground potential. Data is read from the memory cell by applying a voltage of 2 V to the gate and 1.8 V to the drain, and by setting the source to have the ground potential. By detecting an amount of currents flowing between the source and the drain, it is determined whether the memory is in a writing state or an erasing state.

The voltage control circuit 470 includes an internal power supply circuit that supplies a necessary voltage to the semiconductor memory device 400 to thereby drive the semiconductor memory device 400 in the case where, for example, a level of an externally supplied voltage is lower than the necessary level. In the writing and erasing processings, the voltages are applied to the memory array 490 in the form of pulses.

A pulse cycle is set so as to minimize time necessary for the writing and erasing processings and to maximize a life of the memory. The state machine 430 controls each pulse applied to the memory array 490 through the voltage control circuit 470.

Following the writing or erasing processing, the data in the block thus written or erased is verified. Verification of the writing processing is performed by a data comparator (not shown) which compares the data in the block thus written with input data intended to be written to the block.

Likewise, verification of the erasing processing is performed by the data comparator which compares the data in the block thus erased with the intended input data. In the case where the actual data does not coincide with the intended date in the verification of the writing or erasing processing, the comparator determines that the processing has failed. Therefore, the state machine 430 repeatedly outputs write or erase pulses until the processing succeeds or the state machine 430 issues a timeout.

The microprocessor 410 has to wait until one of these two states occurs to recover controlling over the semiconductor memory device 400.

The microprocessor 410 can minimize a wait time by controlling a write timeout interval and an erase timeout interval. The microprocessor 410 executes minimizing the wait time by designating a maximum number of the write or erase pulses transmitted to the memory array 490 in one writing or erasing sequence.

The state machine 430 receives a maximum pulse value and issues the write timeout or the erase timeout when write or erase pulses are repeatedly outputted by the maximum number of times. The microprocessor 410 can determine the write and erase timeout intervals based on the maximum number of write and erase pulses, respectively.

The write and erase pulse cycles are characteristic of the semiconductor memory device 400, and are usually described in a datasheet of the device 400. Therefore, each of the timeout intervals is equal to a number obtained by multiplying the write or erase cycle by the maximum number of write or erase pulses.

This relatively long rewriting time causes a problem in the case where the microprocessor 410 needs to read data from the other part in the memory array 490 before the writing or erasing processing is successfully completed, i.e., needs to interrupt the reading processing.

The microprocessor 410 inputs the maximum pulses to the semiconductor memory device 400 using a method including two steps.

In a first step, the microprocessor 410 issues a command of "set maximum pulse value" to the user command interface 450 through the data bus 411. The command of "set maximum pulse value" comprises a set of digital bits decoded by the user command interface 450. The user command interface 450 allows a pulse counter 420 to receive the maximum pulse value from the data bus 411.

In a second step, the microprocessor 410 outputs data that represents the maximum pulse value to the data bus 411. The pulse counter 420 receives and stores the maximum pulse value.

Alternatively, the user command interface 450 may issue a command of "verify maximum pulse" after the command of "set maximum pulse value". By issuing this command, it is possible to avoid inadvertent deformation of the maximum pulse value.

Figure 21:
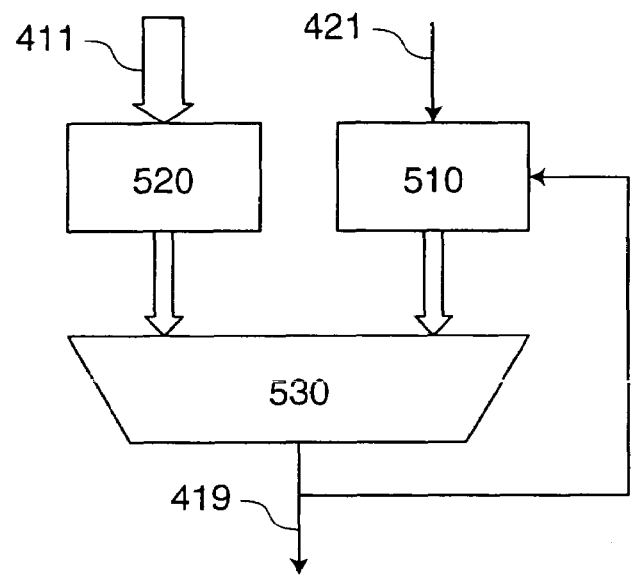
FIG. 21 is a block diagram showing a main part of the semiconductor memory device (tenth embodiment) according to an embodiment of the present invention.

FIG. 21 is a block diagram of the pulse counter 420.

A maximum pulse register 520 stores the maximum pulses for the timeout. The maximum pulse register 520 is initially set at a default maximum pulse value until the microprocessor 410 changes the value. The maximum pulse value is registered in the maximum pulse register 520 through the data bus 411. The maximum pulse register 520 is not a separate register but located in a data storage region present in one block of the memory array 490.

Whenever a write pulse or an erase pulse is outputted, the state machine 430 outputs an active signal to a pulse count line 421. The pulse count line 421 is connected to a counter 510. The counter 510 is an incrementer that increments synchronously with a signal from the pulse count line 421.

Whenever the counter 510 increments, a comparator 530 compares a value of the counter 510 with a value of the maximum pulse register 520. When the value of the counter 510 is equal to that of the maximum pulse counter 520, the comparator 530 generates an active termination signal and transmits the active termination signal to a line 419. The state machine 430 receives the active termination signal 419 and, as a result, does not generate write or erase pulses any more. The state machine 430 stops the present writing or erasing sequence and resets the sequence to an initial state. The status register 460 is updated and notifies the microprocessor 410 that the writing or erasing processing has failed. In the case where the comparator 530 determines that the value of the maximum pulse register 520 is not equal to the value of the counter 510, the comparator 530 does not generate the termination signal. The state machine 430 re-outputs write or erase pulses appropriately.

Figure 22:
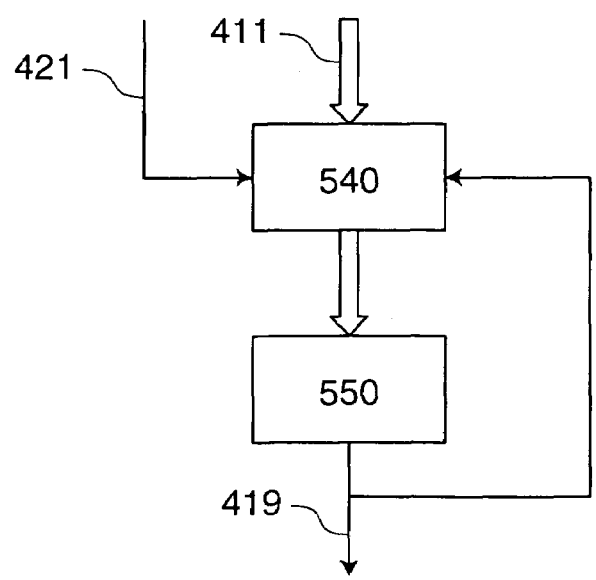
FIG. 22 is a block diagram showing a main part of the semiconductor memory device (tenth embodiment) according to an embodiment of the present invention.

FIG. 22 shows another embodiment of the pulse counter 420. In the embodiment of FIG. 22, the maximum pulse value is inputted to a decrementer 540 through the data bus 411. In one embodiment, the maximum pulse value is initially set at the default and, then, the microprocessor 410 changes the default.

After the maximum pulse value is inputted to the decrementer 540 by the microprocessor 410, the writing or erasing sequence starts.

In another embodiment, the microprocessor 410 stores the maximum pulse value in one block of the memory array 490. Next, the maximum pulse value is inputted to the decrementer 540 from the block. Immediately after the maximum pulse value is inputted thereto, the writing or erasing sequence starts.

Whenever the state machine 430 outputs a write pulse or an erase pulse, an active signal is outputted to the pulse count line 421. Whenever a pulse count signal is outputted, the decrementer 540 decrements by one.

Whenever the decrementer 540 decrements, a comparator 550 compares a value of the decrementer 540 with zero.

When the value of the decrementer 540 is equal to zero, the comparator 550 transmits the active termination signal to the state machine 430 through the line 519. The state machine 430 receives the active termination signal through the line 419 and, as a result, does not output write or erase pulses any more. The state machine 430 stops the present writing or erasing sequence, and resets the sequence to an initial state.

The status register 460 is updated, and notifies the microprocessor 410 that the writing or erasing processing has failed.

In the case where the comparator 550 determines that the value of the decrementer 540 is not equal to zero, the comparator 550 does not generates the active termination signal and the state machine 430 re-outputs write or erase pulses appropriately.

Figure 23:
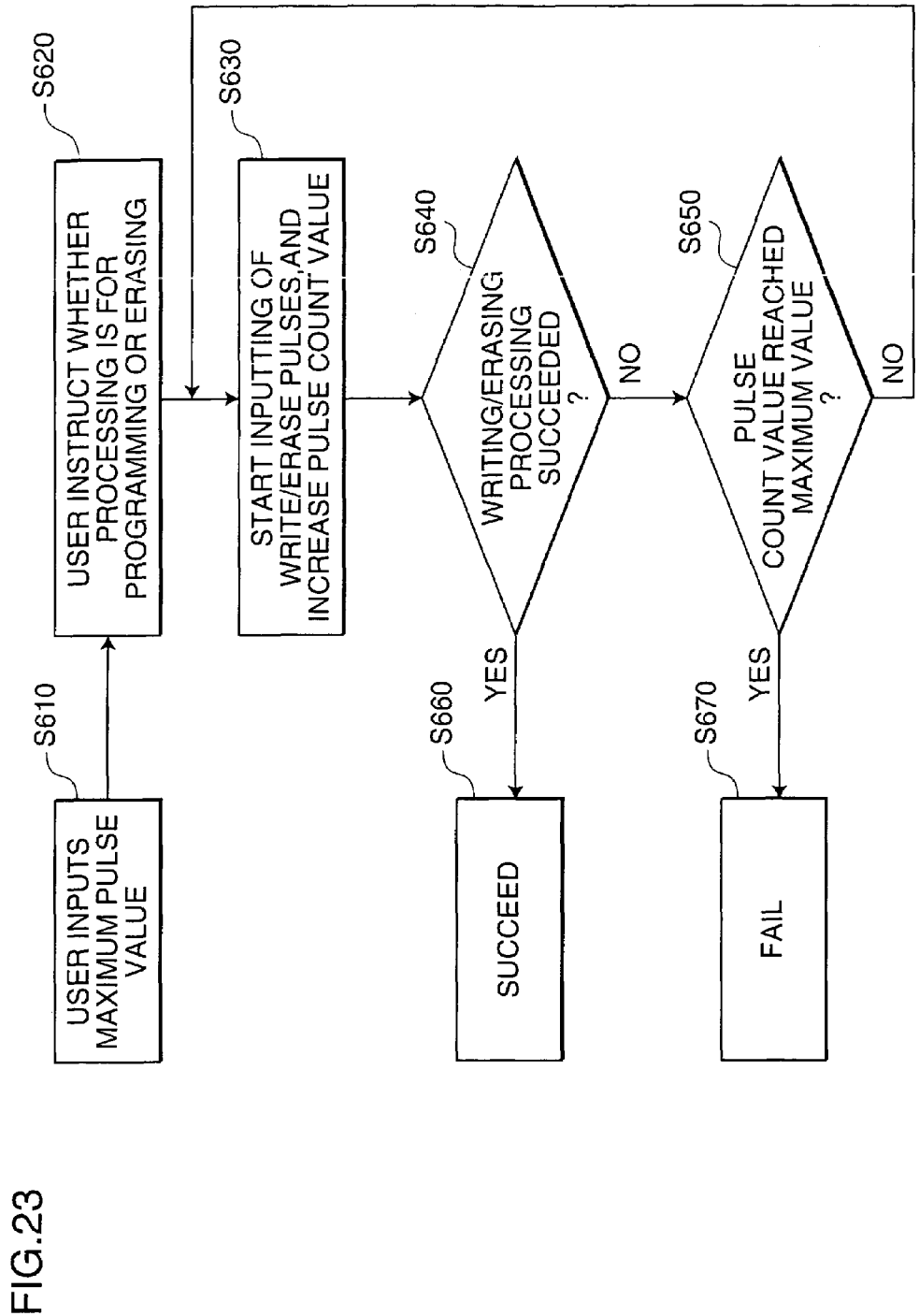
FIG. 23 is a flowchart showing an operation of the semiconductor memory device (tenth embodiment) according to an embodiment of the present invention.

FIG. 23 is a flowchart showing a method of controlling the writing time and the erasing time for the memory array 490 by the microprocessor 410. First, the microprocessor 410 inputs the maximum pulse value (step S610).

The microprocessor 410 outputs the data that represents the command of "set maximum pulse value" to the data bus 411 followed by the data that represents the maximum pulse value. The microprocessor 410 then outputs a write command or an erase command to the semiconductor memory device 400 (step S620).

The write or erase command is decoded by the user command interface 450, and the user command interface 450 resets the pulse counter 420 to its initial value In the pulse counter 420 shown in FIG. 21, the counter 510 is reset to zero (step S620). In the pulse counter 420 shown in FIG. 22, the decrementer 540 is reset to the maximum pulse value (step S620).

The state machine 430 transmits a first write or erase pulse to the memory array 490 (step S630). When the first write or erase pulse is outputted, the pulse counter 420 updates the "present pulse count value" to a value that represents the pulse outputted in the present sequence of the state machine. In the pulse counter 420 shown in FIG. 21, the present pulse counter value is stored in the counter 510 and the counter 510 increments by one (step S630). In the pulse counter 420 shown in FIG. 22, the present pulse counter value is stored in the decrementer 540, and the decrementer 540 decrements by one (step S630).

When the transmission of the write or erase pulses is completed in step S630, the state machine 430 verifies the block in the memory array 490 (step S640). In the case where the verification indicates that the writing or erasing processing has succeeded, the state machine 430 is reset to its initial state, and the state register 460 is updated to indicate that the writing or erasing processing has succeeded.

In the case where the state machine 430 indicates that the writing or erasing processing has failed in the verification step 640, it is necessary to receive one more write or erase pulse. However, in the case where the present pulse count value is not equal to the maximum pulse value, the state machine 430 outputs one more pulse only.

In step S650, the comparator compares the present pulse count value with the maximum pulse value When the comparator indicates that the present pulse value is equal to the maximum pulse value ("Yes" in step S650), the state machine 430 issues the timeout as indicated by step S670. Accordingly, the state machine 430 is reset to its initial value, and the state register 460 is updated to indicate that the writing or erasing processing has failed.

In the case where the comparator indicates that the present pulse value is not equal to the maximum pulse value ("No" in step S650), the processing returns to step S630. Accordingly, the state machine 430 outputs one more write or erase pulse, and the pulse counter 420 updates the present pulse count value.

The method shown in FIG. 23 has been described with reference to the pulse counter 420 and the embodiments shown in FIGS. 21 and 22. Further, the method shown in FIG. 23 is executed by the state machine 430, and the state machine 430 includes a microcontroller. The microcontroller can read and write data from and to the memory and execute an arithmetic command. In one embodiment of the microcontroller, the arithmetic command is executed by an arithmetic logic unit (ALU). Hereinafter, a method of executing the steps shown in FIG. 23 using the microcontroller will now be described.

The microcontroller receives the maximum pulse value (step S610), and stores the received maximum pulse value in a first address of the memory. The microcontroller writes a first pulse count value in a second address of the memory. When a write pulse or an erase pulse is outputted (step S630), the microcontroller reads the pulse count value from the memory and changes the value by one. In one embodiment of the microcontroller, the microcontroller increases the pulse count value by one. In another embodiment, the microcontroller decreases the pulse count value by one. In still another embodiment, a technique for changing the pulse count value by a number greater by one for each write or erase pulse is used.

The microcontroller verifies the block in the memory array 490 (step S640). The microcontroller reads a content of the block, compares the content with intended writing data, and thereby verifies programming. The verification of the erasing processing is performed by reading the content of the block and comparing each bit of the content with the logic value "1". In the case where it is verified in step S640 that the writing or erasing processing has succeeded, the microcontroller updates the status register (step S660). In the case where it is verified in step S640 that the writing or erasing processing has failed, the microcontroller compares the pulse count value stored in the memory with the maximum pulse value, thereby performing the processing in step S650. When the two values are not equal to each other, the microcontroller performs the processing in step S630. When the two values are equal to each other, the microcontroller updates the status register (step S670) and does not output write or erase pulses any more.

In one embodiment, the microcontroller uses two different maximum pulse values so as to perform the processing in step S650. The first maximum pulse value corresponds to the writing processing, and is used in step S650 only when the microcontroller executes inputting of write pulses. The second maximum pulse value corresponds to the erasing processing, and is used in step S650 when the microcontroller executes inputting of erase pulses.

This semiconductor memory device employs the state machine that automatically writes and erase data to and from the memory array. Therefore, a user of the semiconductor memory device can control the number of times of writing or erasing repeated in the automatic memory array writing or erasing processing.

Eleventh Embodiment

Figure 24:
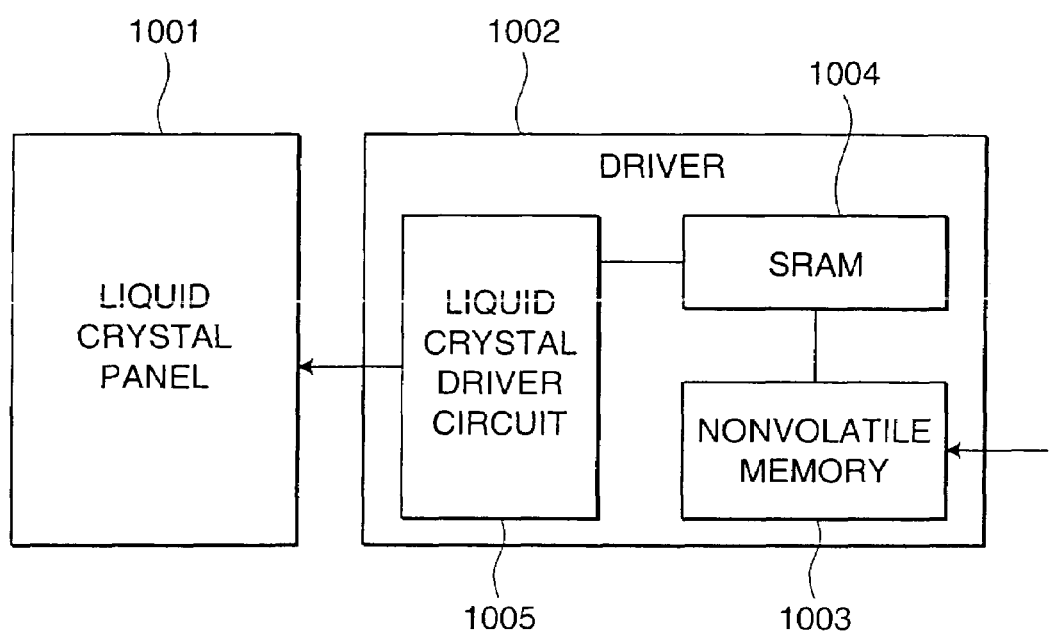
FIG. 24 is a schematic configuration diagram showing a liquid crystal display device (eleventh embodiment) incorporating therein the semiconductor memory device according to an embodiment of the present invention.

As an application example of the semiconductor memory device, for example, as shown in FIG. 24, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the memory cell of an embodiment of the present invention, more preferably, any of the semiconductor memory devices of the first to ninth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 24 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the memory cell of an embodiment of the present invention. Particularly, it is preferable to use any of the semiconductor memory devices of the first to ninth embodiments in which memory cells of the present invention are integrated.

Twelfth Embodiment

Figure 25:
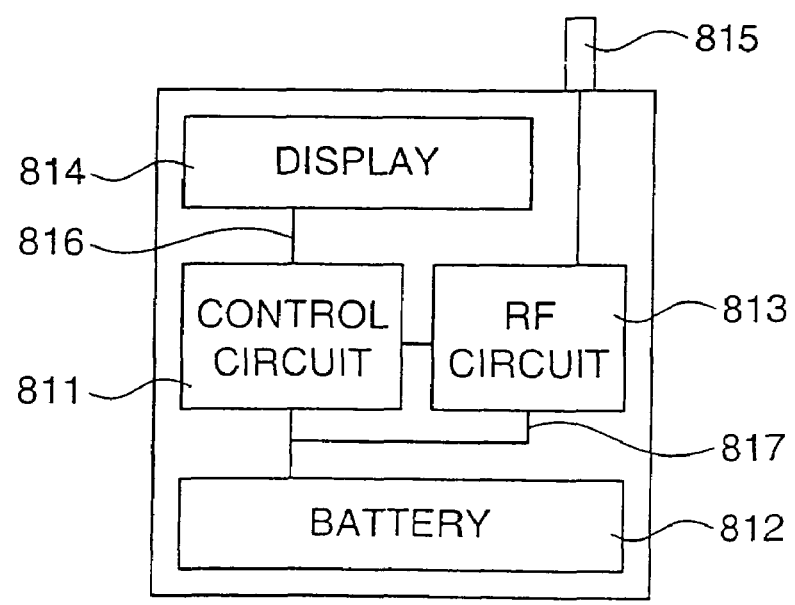
FIG. 25 is a schematic configuration diagram showing a portable electronic apparatus (twelfth embodiment) incorporating therein the semiconductor memory device according to an embodiment of the present invention.
Figure 26:
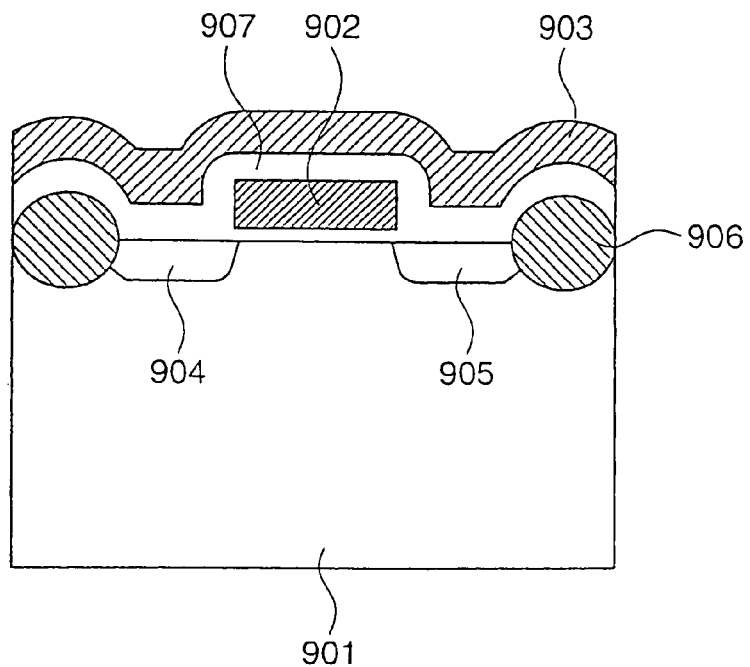
FIG. 26 is a schematic sectional view showing a main part of a conventional flash memory.

FIG. 25 shows a portable telephone as a portable electronic apparatus in which the semiconductor memory device is assembled.

The portable telephone is constructed mainly by a control circuit 811, a battery 812, an RF (radio frequency) circuit 813, a display 814, an antenna 815, a signal line 816, a power source line 817 and the like. In the control circuit 811, the semiconductor memory device of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

By using the semiconductor memory device capable of performing high-speed reading operation and whose process of mounting a memory part and a logic circuit part simultaneously is easy for a portable electronic apparatus, the operation speed of the portable electronic apparatus is increased, and the manufacturing cost can be reduced. Thus, a cheap, high-reliability, and high-performance portable electronic apparatus can be obtained.

According to the semiconductor memory device and the method of driving the semiconductor memory device of an embodiment of the present invention, it is possible to improve efficiency of a reading/writing, rewriting cycle and, also, to optionally control memory array writing/erasing processing time.

Furthermore, according to an embodiment of the present invention, since the memory cell includes the gate electrode formed on the semiconductor layer via the gate insulating film, the channel region disposed under the gate electrode, the diffusion regions disposed on both sides of the channel region and having the conductive type opposite to that of the channel region, and the memory functional units formed on both sides of the gate electrode and having the function of retaining charges, the process for forming the memory cell has very high affinity with the process for forming a normal transistor. Therefore, it is possible to remarkably reduce the number of masks and the number of processes in comparison with the case of the combination with a peripheral circuit consisting of the normal transistor by using a conventional flash memory as a nonvolatile memory cell. Thus, it is possible to enhance the yield of the chip and reduce the cost.

The memory functional unit of the memory cell includes a film having a surface substantially parallel to a surface of the gate insulating film and having the function of retaining charges. It is thereby possible to suppress variations in memory effect, and a probability of success of the rewriting operation increases, consequently, it is possible to set the maximum pulse value smaller than the conventional maximum pulse value, and to complete the rewriting operation in shorter time. In addition, the probability of occurrence of a rewriting operation failure decreases.

A region of a higher impurity concentration than that of a region in the vicinity of the surface of the semiconductor layer under the gate electrode is provided in the vicinity of the diffusion region of the memory cell. The memory effect is thereby improved and the rewriting speed is increased. The memory cell includes a film having a surface substantially parallel to the surface of the gate insulating film and the function of retaining charges, and an insulating film for separating the film from the channel region or the semiconductor layer, and the insulating film is thinner than the gate insulating film and is 0.8 nm or more. The amount of charges induced to the channel region or the well region increases to thereby improve the memory effect. In addition, this facilitates injecting charges into each memory functional unit to thereby increasing the rewriting speed.

Since the memory cell exhibits the great memory effect, it is possible to set a design margin for determining whether the memory cell is in a writing state or an erasing state to be large, and to increase the probability of the success of the rewriting operation. Accordingly, it is possible to set the maximum pulse value smaller than the conventional maximum pulse value, and to complete the rewriting operation in shorter time. Further, the probability of the occurrence of the rewriting operation failure decreases.

The memory functional unit of the memory cell includes the charge retaining film extending substantially parallel to the side surface of the gate electrode, whereby the rewriting speed is increased.

As can be seen, since the memory cell of an embodiment of the present invention is faster in rewriting speed than the conventional memory cell, the rewriting operation can be completed in shorter time than the conventional flash memory.

Additionally, since the electronic apparatus, in particular, the portable electronic apparatus according to an embodiment of the present invention includes the above-described semiconductor memory device, it is possible to facilitate the combination process of the memory and the logic circuit, so as to increase the operating speed of the electronic apparatus, reduce the fabricating cost, and provide a display device of high reliability at a reduced cost.

The invention claimed is:

1. A semiconductor memory device, comprising:
   a memory array;
   a storage section that receives a maximum pulse value from a user of the semiconductor memory device;
   a control section that executes a writing processing or an erasing processing for the memory array and restarts the writing or erasing processing in the case where the processing for the memory array has failed;
   a counter section that counts up a number of processings performed by the control section; and
   a detection section that detects when the number of processings is equal to the maximum pulse value to prevent the control section from restarting the writing or erasing processing, wherein
   the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

2. The semiconductor memory device according to claim 1, wherein
   the memory functional unit of the memory cell includes a film having a surface substantially in parallel to a surface of the gate insulating film and having the function of retaining charges.

3. The semiconductor memory device according to claim 1, wherein
   the memory cell includes a film having a surface substantially in parallel to a surface of the gate insulating film and the function of retaining charges, and an insulating film for separating the film from the channel region or the semiconductor layer, and the insulating film has a thickness thinner than the gate insulating film and not thinner than 0.8 nm.

4. The semiconductor memory device according to claim 1, wherein
   the semiconductor layer of the memory cell includes a region of a higher impurity concentration in the vicinity of the diffusion region than that of a region in the vicinity of a surface of the semiconductor layer under the gate electrode.

5. A portable electronic apparatus, comprising:
   the semiconductor memory device according to claim 1.

6. A method of driving a semiconductor memory device, comprising the steps of:
   (1) determining a predetermined number of times of execution designated by a user for a processing for a memory array of the semiconductor memory device;
   (2) setting a pulse counter value to an initial value;
   (3) starting a writing processing or an erasing processing performed on the memory array by a state machine of the semiconductor memory device to change the pulse counter value;
   (4) verifying the memory array to determine whether the processing has succeeded; and
   (5) repeating steps (2) and (3) until the pulse counter value is equal to the predetermined number of times of execution in the case where it is determined that the processing has failed, wherein
the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

7. The method of driving a semiconductor memory device according to claim 6, wherein
the memory functional unit of the memory cell includes a film having a surface substantially parallel to a surface of the gate insulating film and having the function of retaining charges.

8. The method of driving a semiconductor memory device according to claim 6, wherein
the memory cell includes a film having a surface substantially in parallel to a surface of the gate insulating film and the function of retaining charges, and an insulating film for separating the film from the channel region or the semiconductor layer, and the insulating film has a thickness thinner than the gate insulating film and not thinner than 0.8 nm.

9. The method of driving the semiconductor memory device according to claim 6, wherein
the semiconductor layer of the memory cell includes a region of a higher impurity concentration in the vicinity of the diffusion region than that of a region in the vicinity of a surface of the semiconductor layer under the gate electrode.

10. A method of driving a semiconductor memory device, comprising the steps of:
(1) setting a pulse counter value to an initial value;
(2) changing the pulse counter value when a writing processing or an erasing processing on a memory array starts;
(3) verifying the memory array to determine whether the processing has succeeded;
(4) comparing the pulse counter value with a final value when it is determined that the processing has failed; and
(5) repeating steps (2) to (4) until the pulse count value is equal to the final value, wherein
the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

11. The method of driving a semiconductor memory device according to claim 10, wherein
the final value is zero, and
step (2) further includes the step of decreasing the pulse count value by one.

12. The method of driving a semiconductor memory device according to claim 10, wherein
the initial value is zero, and
step (2) further includes the step of increasing the pulse count value by one.

13. A method of driving a semiconductor memory device, comprising the steps of:
(1) setting a pulse counter value to an initial value;
(2) registering a final value in a register;
(3) changing the pulse counter value when a writing processing or an erasing processing for a nonvolatile memory array starts;
(4) verifying the nonvolatile memory array to determine whether the processing has succeeded;
(5) comparing the pulse counter value with a final value when it is determined that the writing or erasing processing has failed; and
(6) repeating steps (2) to (5) until the pulse count value is equal to the final value, wherein
the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

14. A method of driving a semiconductor memory device, comprising the steps of:
(1) receiving a maximum pulse command from a microprocessor;
(2) receiving a predetermined number of times of execution designated by a user for a processing for a memory array in the semiconductor memory device, from the microprocessor;
(3) starting on the memory array a writing processing or an erasing processing to be executed by a state machine of the semiconductor memory device;
(4) verifying the memory array to determine whether the processing has succeeded;
(5) repeating steps (2) and (3) until step (2) is executed by the predetermined number of times of execution in the case where the processing has failed, wherein
the memory array includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges.

15. The method of driving a semiconductor memory device according to claim 14, wherein
the step (2) further includes the step of storing a value designated by the user in a register.

* * * * *